US012112960B2

(12) United States Patent
Kwon et al.

(10) Patent No.: US 12,112,960 B2
(45) Date of Patent: Oct. 8, 2024

(54) APPARATUS FOR PROCESSING SUBSTRATE AND METHOD OF DETERMINING WHETHER SUBSTRATE TREATMENT PROCESS IS NORMAL

(71) Applicant: SEMES CO., LTD., Cheonan-si (KR)

(72) Inventors: Ohyeol Kwon, Cheonan-si (KR); Soo Yeon Shin, Suwon-si (KR); Hyun Hoo Kim, Cheonan-si (KR); Myung Chan Cho, Anyang-si (KR)

(73) Assignee: SEMES CO., LTD., Cheonan-si (KR)

( * ) Notice: Subject to any disclaimer, the term of this patent is extended or adjusted under 35 U.S.C. 154(b) by 497 days.

(21) Appl. No.: 17/474,469

(22) Filed: Sep. 14, 2021

(65) Prior Publication Data

US 2022/0093430 A1    Mar. 24, 2022

(30) Foreign Application Priority Data

Sep. 18, 2020    (KR) ..................... 10-2020-0120202

(51) Int. Cl.
*G06T 7/00* (2017.01)
*G06N 3/045* (2023.01)
*H01L 21/67* (2006.01)

(52) U.S. Cl.
CPC ....... *H01L 21/67253* (2013.01); *G06N 3/045* (2023.01); *G06T 7/0004* (2013.01); *G06T 2207/20081* (2013.01); *G06T 2207/20084* (2013.01); *G06T 2207/30148* (2013.01)

(58) Field of Classification Search
CPC ......... H01L 21/67253; H01L 21/67288; H01L 21/67051; H01L 21/67276; G06N 3/045; G06N 3/08; G06N 3/04; G06N 20/00; G06T 7/0004; G06T 2207/20081; G06T 2207/20084; G06T 2207/30148; G06T 7/12; G06T 7/66; G06T 2207/10004; G06T 5/00; G06T 7/001; G06T 7/13; G06F 18/241

See application file for complete search history.

(56) References Cited

U.S. PATENT DOCUMENTS

| 2020/0111715 A1* | 4/2020 | Naohara ............... H04N 23/695 |
| 2020/0258214 A1* | 8/2020 | Motamedi ......... H01L 21/67253 |

FOREIGN PATENT DOCUMENTS

| JP | 2013-014029 A | 1/2013 |
| KR | 10-2011-0013895 A | 2/2011 |
| KR | 10-2017-0050448 A | 5/2017 |
| KR | 10-2019-0088013 A | 7/2019 |
| KR | 10-2020-0014938 A | 2/2020 |
| KR | 10-2020-0039574 A | 4/2020 |
| KR | 102228957 B1 | 3/2021 |

OTHER PUBLICATIONS

Office Action for Korean Application No. 10-2020-0120202 dated May 23, 2023.

* cited by examiner

*Primary Examiner* — Ping Y Hsieh
(74) *Attorney, Agent, or Firm* — Harness, Dickey & Pierce, P.L.C.

(57) ABSTRACT

The inventive concept provides a method to determine whether a substrate treatment process is normal using a deep learning model. The method comprising receiving input on a substrate treatment process video, preprocessing the inputted video, using the deep learning model to study a preprocessed video, and determining whether the substrate treatment process is normal by comparing the trained model and a real time substrate treatment process video.

12 Claims, 6 Drawing Sheets

APPARATUS FOR PROCESSING SUBSTRATE AND METHOD OF DETERMINING WHETHER SUBSTRATE TREATMENT PROCESS IS NORMAL

CROSS-REFERENCE TO RELATED APPLICATIONS

A claim for priority under 35 U.S.C. § 119 is made to Korean Patent Application No. 10-2020-0120202 filed on Sep. 18, 2020, in the Korean Intellectual Property Office, the entire contents of which are hereby incorporated by reference.

BACKGROUND

Embodiments of the inventive concept described herein relate to an apparatus for processing a substrate and method of determining whether a substrate treatment process is normal. More specifically, embodiments of the inventive concept described herein relate to a method and apparatus which determine whether a substrate treatment process is normal using a deep learning model.

A conventional substrate treatment process apparatus uses a vision sensor to determine whether a substrate treatment process is normal. However, in such a method using the vision sensor, a bowl may block the vision sensor from sensing a target site, thereby making it difficult to detect whether the substrate treatment process is being normally conducted.

More specifically, in the conventional art, a plurality of nozzles are used depending on a processing recipe and the bowl is high, and thus it is not easy to detect the existence of the substrate. Also, the nozzles spray aerosols in various forms according to N2 flow rate and the forms of sprayed aerosol are transparent and irregular, making the conventional vision sensor hard to diagnose the form of the spray. Further, a spreading form of sprayed aerosols may be affected and irregular according to a wetting of the substrate which depends on a discharge flow rate, a discharge position, RPM, and a hydrophilicity or hydrophobicity of a substrate surface, or the like, making the conventional vision senor further hard to diagnose.

Therefore, there is an ongoing need for a new method to diagnose in situ the substrate processing.

SUMMARY

Embodiments of the inventive concept provide a method for determining in situ whether a substrate treatment process is normal.

The technical objectives of the inventive concept are not limited to the above-mentioned ones, and the other unmentioned technical objects will become apparent to those skilled in the art from the following description and drawings.

In an embodiment of the inventive concept, provided is a method for determining whether a substrate treatment process is normal using a deep learning model.

The method includes receiving an input image of a substrate processing, preprocessing the input image, learning the preprocessed input image by using a deep learning model; and comparing a real time substrate treatment process image and a learned data by using the trained deep learning model and determining whether the substrate treatment process is normal.

In an embodiment of the inventive concept, the preprocessing the input image comprises recognizing a tip area of a nozzle in the input image of the substrate processing, a chemical being sprayed from the tip area of the nozzle.

In an embodiment, choosing the recognized tip area of the nozzle as a ROI may be comprised.

In an embodiment, the learning the preprocessed input image by using the deep learning model comprises learning the ROI according to flow rates of the chemical.

In an embodiment, the preprocessing the input image comprises correcting a perspective distortion of the input image.

In an embodiment, the preprocessing the input image comprises detecting a shape of a substrate from the perspective distortion corrected input image and detecting a central point of the shape of the substrate.

In an embodiment, the preprocessing the input image further comprises converting a coordinate system to a polar coordinate system based on the detected central point.

In an embodiment, choosing a constant edge range of the substrate in the polar coordinate system as a ROI may be comprised.

In an embodiment, learning the preprocessed input image by using the deep learning model comprises learning the ROI.

In another embodiment, provided is a substrate treatment process device which processes a substrate by spraying a chemical.

The device comprises an image capturing unit for capturing an image of the substrate and the chemical sprayed on the substrate, and a determining unit for determining whether a substrate treatment process is normal by using a deep learning model.

In an embodiment, the determining unit comprises: a preprocessing unit for preprocessing data of the image captured by the image capturing unit; a learning unit for learning the preprocessed data by using a deep learning model; and a comparing unit that determines whether the substrate treatment process is normal by comparing a real time substrate treatment process image and a learned data in the learning unit.

In an embodiment, the determining unit determines whether the substrate treatment process is normal based on either a spray state of a discharge chemical on the substrate or a wetting state of the substrate.

In an embodiment, the preprocessing unit may choose a part of a region of the substrate and the chemical sprayed on the substrate imaged from the image capturing unit, as the region of interest (ROI).

In an embodiment, the preprocessing unit chooses part of the image of the substrate and a chemical sprayed on the substrate captured by the image capturing unit as the region of interest.

In an embodiment, the preprocessing unit is configured to compensate a perspective distortion of the data of the image.

In an embodiment, the preprocessing unit is configured to detect a shape of a substrate from a perspective distance distortion corrected data, and detect the central point from the shape of the substrate.

In an embodiment, the preprocessing unit converts a coordinate system into a polar coordinate system based on the detected central point.

In an embodiment, the preprocessing unit chooses the constant edge range of the substrate converted in the polar coordinate system as the ROI.

In an embodiment, training the deep learning model prevents processing defects.

In an embodiment, a preprocessing step before training the deep learning model aids more effective training.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Figure 1:
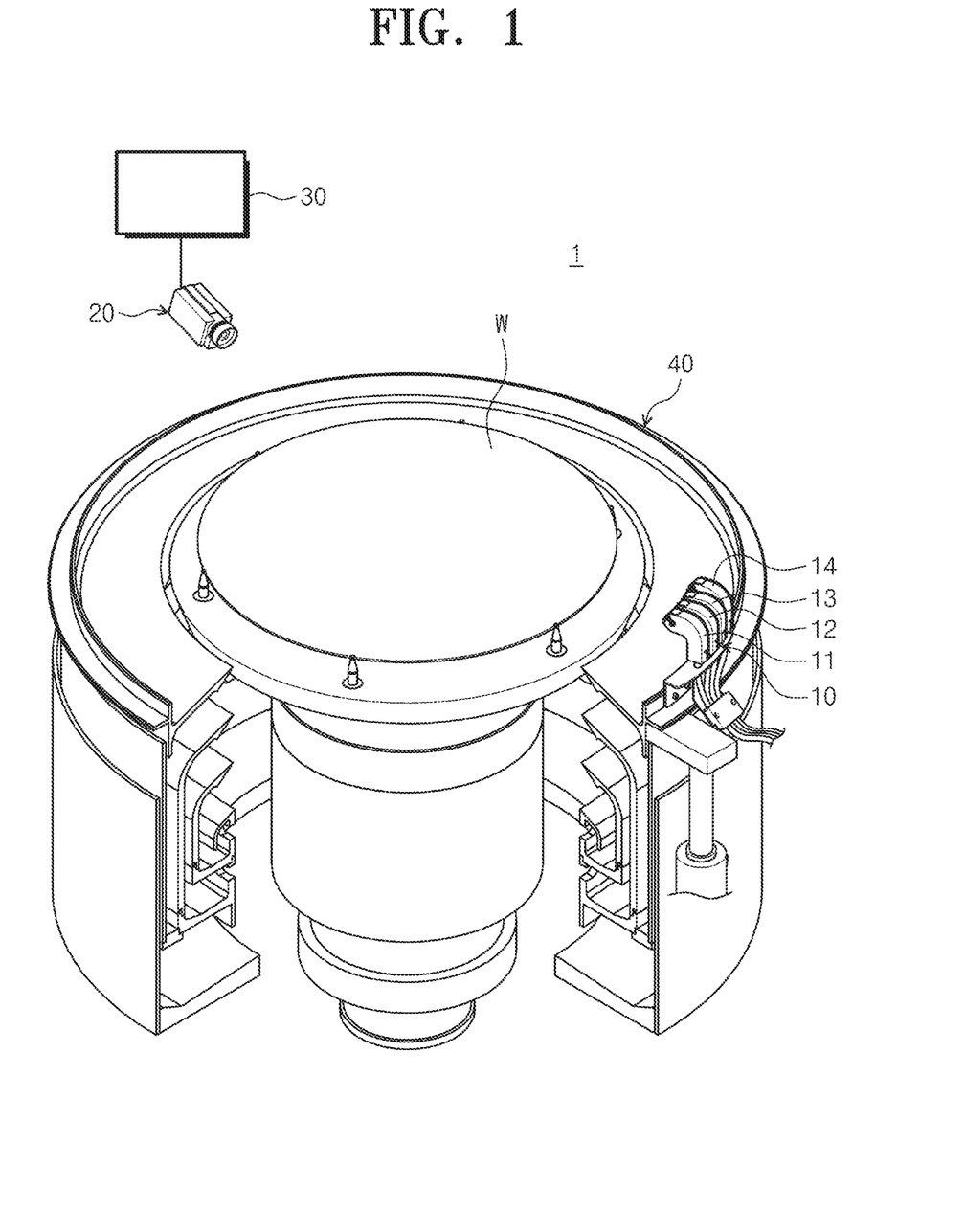
FIG. 1 is a figure illustrates in exemplary way a substrate treatment process apparatus according to an embodiment of the inventive concept.

FIG. 1 illustrates in exemplary way a substrate treatment process apparatus 1 according to an embodiment of the inventive concept.

The substrate treatment process apparatus 1 in FIG. 1 can process a substrate W through a liquid which is discharged through a plurality of nozzle outlets 11, 12, 13, and 14 to the substrate W. In an embodiment of the inventive concept the discharge liquid may be a cleaning liquid or a chemical. According to an embodiment of the inventive concept, the liquid discharged from the plurality of nozzle outlets 11, 12, 13, and 14 may be sprayed in an aerosol form. The discharge liquid can be provided to the surface of the substrate W.

According to the substrate treatment process apparatus 1 in an embodiment of the inventive concept may be provided with a fixed nozzle 10 to discharge processing liquid to the substrate. The fixed nozzle 10 may include the plurality of nozzle outlets 11, 12, 13, and 14. According to an embodiment of FIG. 1, as an exemplary way, the fixed nozzle 10 includes four nozzle outlets 11, 12, 13, and 14.

The substrate treatment process apparatus 1 in FIG. 1 may include a bowl 40 surrounding the substrate W. Through the bowl 40 there may be an effect of preventing the scattering of discharge liquid sprayed from the nozzle.

The substrate treatment process apparatus 1 may include an image capturing unit 20 and a determining unit 30.

The image capturing unit 20 may capture an image of the discharge liquid during a discharge from the fixed nozzle 10. Also, the image capturing unit can capture the substrate W after the discharge liquid has been discharged. In an embodiment the image capturing unit 20 may be a vision camera. The image capturing unit 20 may be disposed to capture an image of the entire substrate W. The image capturing unit 20 may be placed at a corner of the chamber to enable it to capture an image of entire substrate W. In an embodiment the image capturing unit 20 may image the substrate W and the discharge liquid being discharged to the substrate W in real time.

A determining unit 30 can be connected to the image capturing unit 20 and use the images captured by the image capturing unit 20 to determine whether the substrate treatment process is normal using a deep learning model. The specific configuration of the determining unit 30 may be explained in further detail referring to FIG. 2.

Figure 2:
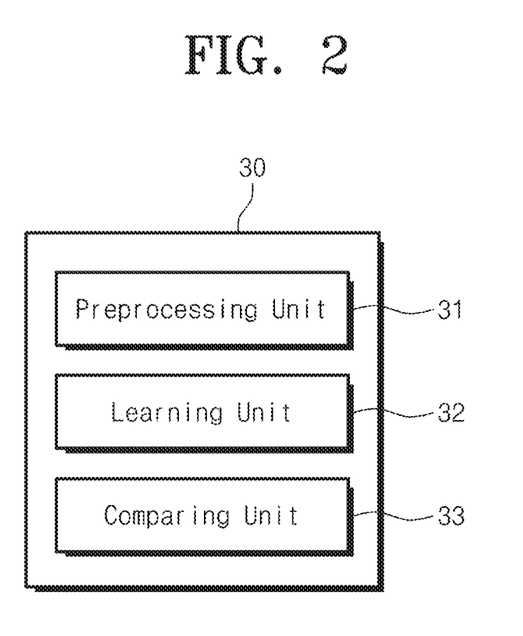
FIG. 2 is a block diagram illustrating the configuration of a determining unit according to an embodiment of the inventive concept.
Figure 3:
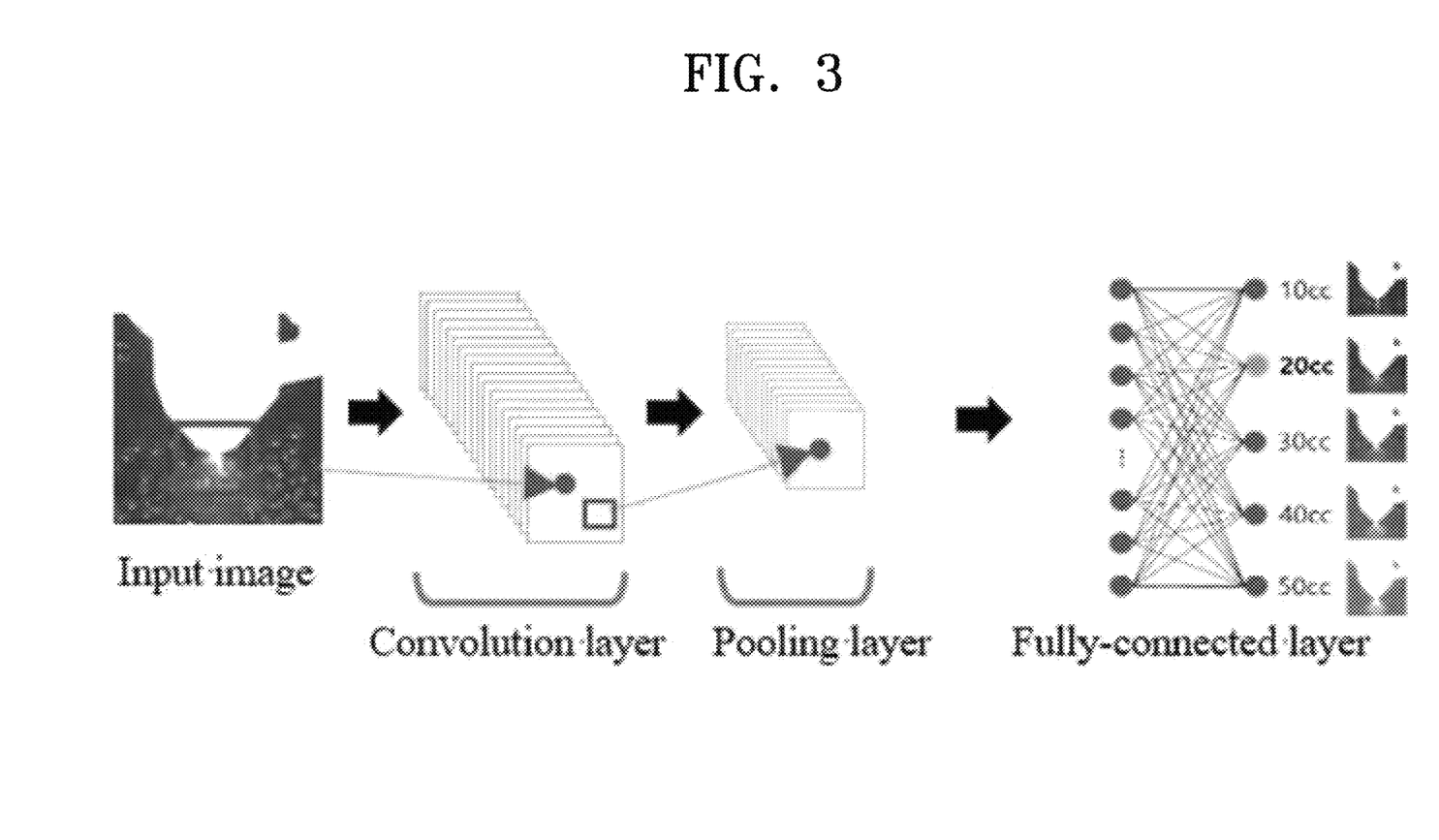
FIG. 3 is a view to illustrate a selection of a region of interest to study aerosol sprays according to an embodiment of the inventive concept.
Figure 4:
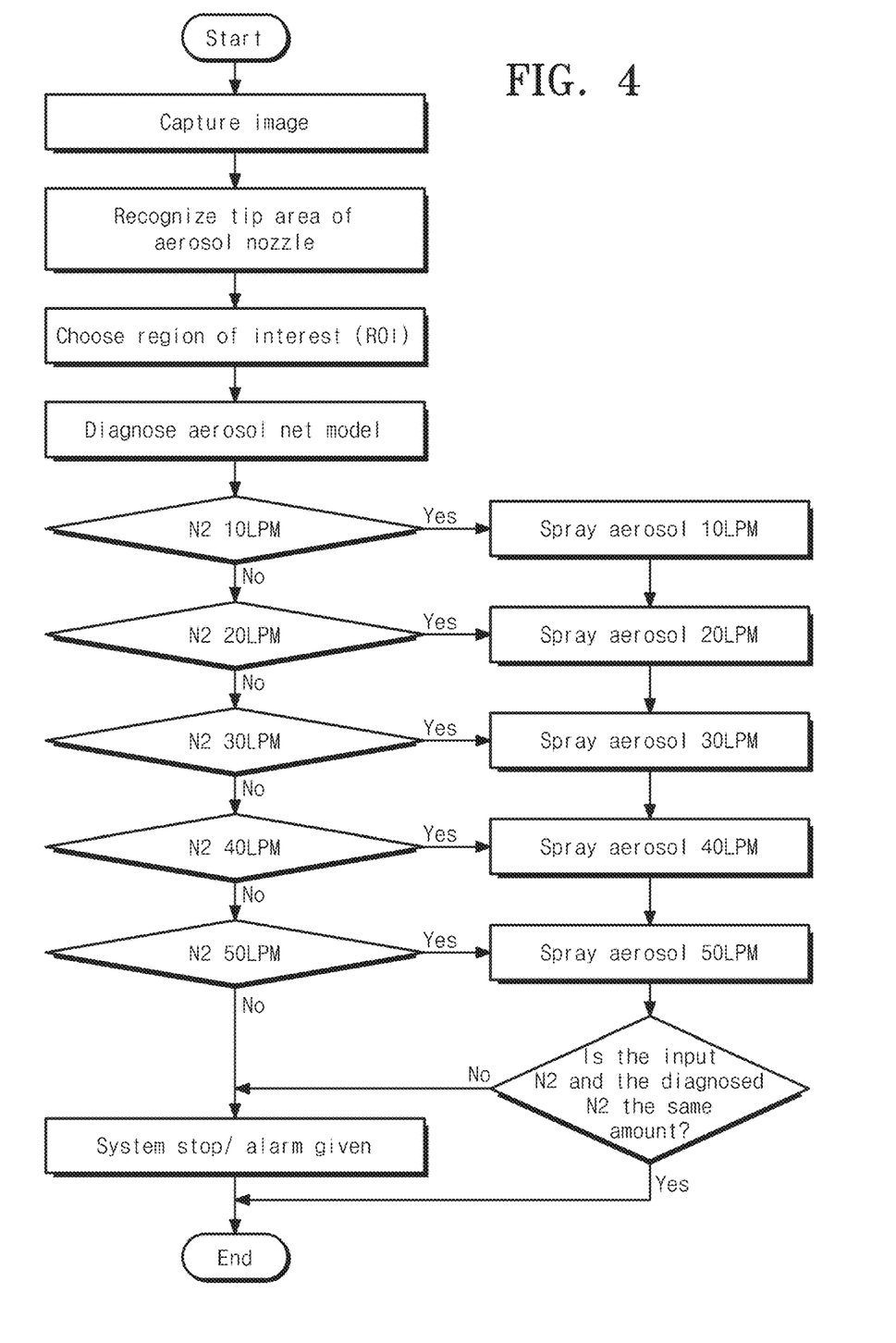
FIG. 4 is a flow chart to illustrate the method to determine whether the aerosol spray form is normal according to an embodiment of the inventive concept.
Figure 5:
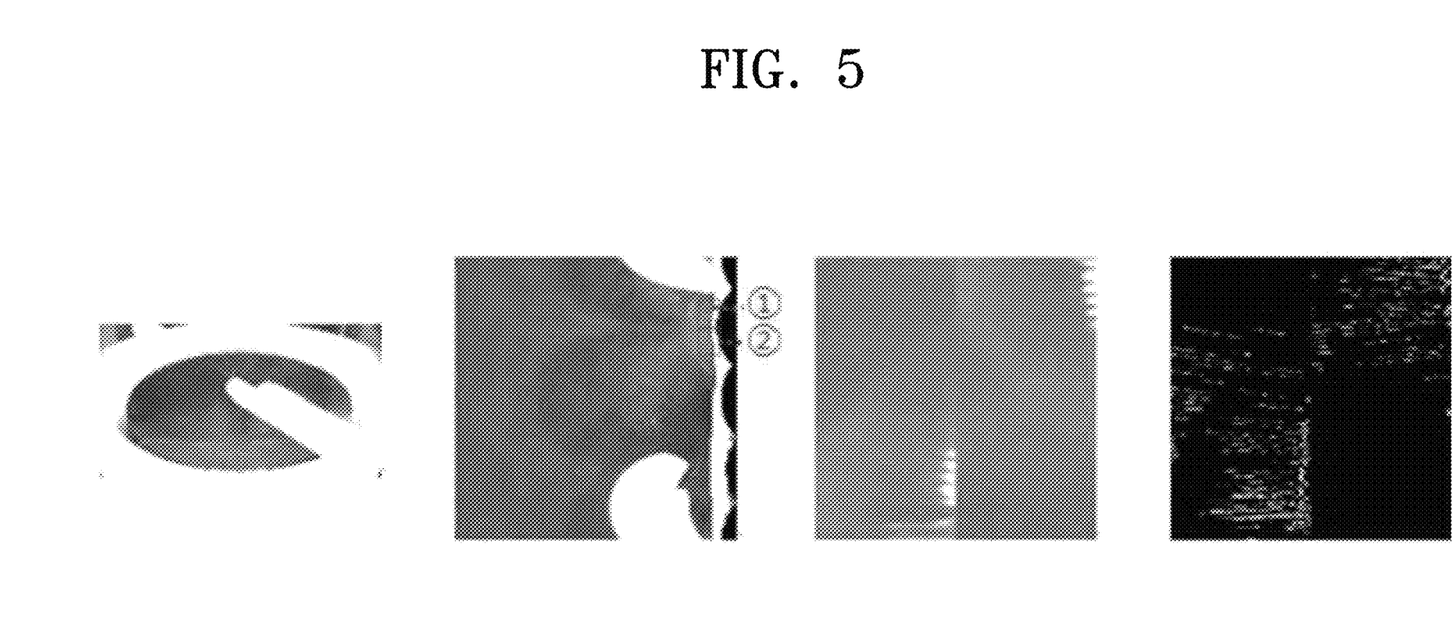
FIG. 5 is a view illustrating the selection of a region of interest to learn the wetting state of a substrate according to an embodiment of the inventive concept.

FIG. 2 illustrates the configuration of the determining unit 30 according to an embodiment of the inventive concept.

In an embodiment the determining unit 30 may include a preprocessing unit 31, a learning unit 32, and a comparing unit 33.

The preprocessing unit 31 may perform preprocessing on data of images captured by the image capturing unit 20. The learning unit 32 may perform deep learning on the preprocessed data from the preprocessing unit 31. The comparing unit 33 may determine whether the substrate t processing is normal by comparing with the learned data from the learning unit 32.

In an embodiment, the state determined by the determining unit 30 on whether the substrate treatment process is normal may be either a spray state of the discharged chemical on the substrate or a wetting state of the substrate. In another embodiment of the inventive concept, the determining unit 30 may determine whether the substrate exists in the chamber.

In an embodiment, the determining unit 30 may diagnose an aerosol spray form which is sprayed from the nozzle.

Figure 6:
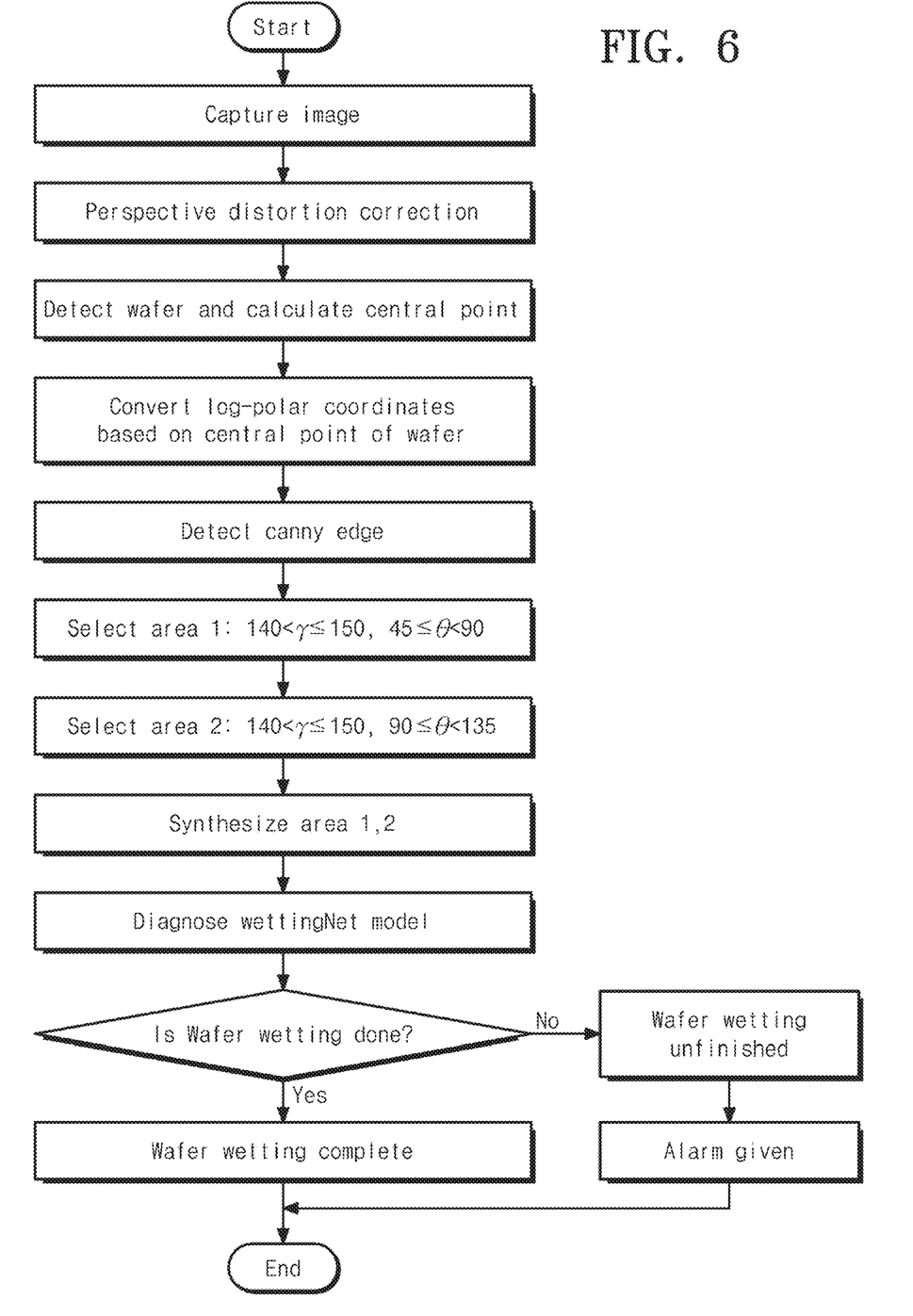
FIG. 6 is a flow chart illustrating the method to determine whether the substrate's wetting state is normal according to an embodiment of the inventive concept.

Through this, the aerosol spray form images of N2 may be used to learn an Aerosol Net model. Based on the learned Aerosol Net model, the aerosol spray form may be diagnosed.

According to an embodiment of the inventive concept, the determining unit 30 may diagnose the wetting state of the substrate. Images of the wetting state of the substrate and non-wetting state of the substrate, a Wetting Net model may be trained, and determine the wetting state of the substrate based on the trained Wetting Net model.

More specifically, in an embodiment, the preprocessed unit 31 may perform preprocessing on the data of images captured by the image capturing unit 20. The preprocessing unit 31 may revise the image data so as to enhance increase training efficiency before the deep learning model is trained using the images captured by the image capturing unit 20. The detailed preprocessing in the preprocessing unit 31 will be explained later with reference to FIG. 3 and FIG. 5.

The learning unit 32 in an embodiment of the inventive concept may use the deep learning model to learn the preprocessed data. In an embodiment, Tensor Flow developed by the Google Brain Team may be used as the deep learning model.

TensorFlow is a software library for mathematical computing using data flow graphs. A graph node represents the mathematical calculations while a graph edge represents a multi-dimensional data array (tensor) which flows between nodes.

Aside from the TensorFlow other mathematical libraries for general machine learning application and neural networks can be employed. In an embodiment, the deep learning model is re-trained only with positive data and the negative data is discarded.

The comparing unit 33 may determine whether the substrate treatment process is normal by using the learned data in the learning unit 32. In an embodiment, the learned data in the learning unit 32, and the real time imaged data imaged through the image capturing unit 20 may be compared to determine whether currently the substrate treatment process is normal in real time.

FIG. 3 illustrates the selection of a region of interest (ROI) to learn the spray of aerosol according to an embodiment of the inventive concept.

According to FIG. 3, the preprocessing unit 31 according to an embodiment of the inventive concept may choose a part of the image of the substrate and a chemical sprayed on the substrate captured by the image capturing unit 20 as the region of interest (shown as a rectangular red line). In an embodiment, the region of interest may be a tip area in an image of the substrate processing, the tip area being a chemical sprayed area by a nozzle.

In an embodiment, to determine whether an aerosol spray form is normal, an area near the tip area is selected as the region of interest (ROI) by the preprocessing unit 31, and the selected ROI images are learned, thereby increasing the learning effects. In the conventional art, the sprayed forms of the discharge liquid were irregular because they were a mist form, the sprayed forms of the discharge liquid are transparent, and it is difficult to deduct the discharge liquid because of vibrations of the pump.

In an embodiment, by excluding the entire image and designating only a certain area as the region of interest (ROI), only a nozzle area can be learned by selecting the nozzle are as the ROI, thereby enhancing learning efficiency. Also, by learning on each N2 flow rate, whether discharge is normal can be verified in each flow rate.

FIG. 4 is a flow chart to determine whether an aerosol spray form is normal according to an embodiment of the inventive concept.

According to FIG. 4, the substrate and the spray form of the nozzle can be captured at the image capturing unit 20. The captured image is input to the preprocessing unit 31. In the preprocessing unit 31, an aerosol tip area is selected as the region of interest from the input image data and it can be provided in a preprocessed state for training the deep learning model. According to FIG. 4, the spray form according to each volume of the nozzle can be learned on the base of such preprocessed states. In an embodiment, learning can be done on each of the N2 flow rates from the nozzle 10, 20, 30, 40, and 50. Whether the input flow rate of N2 and the diagnosed flow rate of N2 are the same can be determined by comparing the learned data by the deep learning model on each flow rate and real time aerosol spray in each flow rate. Through this, whether the aerosol spray form discharged from the nozzle is normal can be determined.

FIG. 5 illustrates the selection of the region of interest for learning the wetting state of the substrate in an embodiment of the inventive concept.

The wetting state of the substrate refers to whether the chemical has been uniformly applied on the entire area of the substrate.

According to FIG. 5, preprocessing can be done to learn the wetting state of the substrate. It may be difficult to determine the specific wetting state because the image capturing unit 20 is placed diagonally, causing the shape of the substrate to be captured in an oval shape instead of a circular shape. Therefore, to correct distortion, perspective distortion correction may be conducted to make a circular shape. After the process of perspective distortion correction, the substrate is corrected to a circular shape, and the central point of the substrate can be calculated after detecting the substrate from the image. Also, after calculating the central point, a coordinate system can be converted into a polar coordinate system. The conventional coordinate system (x, y) can be converted to a cartesian coordinate system (r, θ). The conversion can be done with the following equation.

$$r = \sqrt{x^2 + y^2}$$

$$\theta = \tan^{-1}\left(\frac{y}{x}\right)$$

In an embodiment the coordinates expressing the substrate's wetting state (x, y) may be converted into the cartesian coordination system's (r, θ). Through this, when a certain point of the substrate has not been wetted, it can be identified. In an embodiment of the inventive concept, the scope of r and the scope of θ of the polar coordinate system may be limited to choose a certain region of the substrate which may not be wetted as the region of interest to be learned. In an embodiment, regarding the wetting state of the substrate conversed to the polar coordinate system, as the preprocessing a constant edge range of the substrate can be selected as the region of interest and the selected region of interest can be learned. Here, a constant edge range refers to a range of the positions on the substrate with a high possibility of defect in substrate wetting.

FIG. 6 is a flow chart to illustrate the method for determining whether the wetting state of the substrate is normal according to an embodiment of the inventive concept.

Referring to FIG. 6, the image capturing unit may capture the image of the wetting state of the substrate. The captured image of the wetting state of the substrate is delivered to the preprocessing unit for preprocessing prior to deep learning. In the preprocessing by the preprocessing unit, perspective distortion correction is conducted first, and then the wafer and a center of the substrate are detected from the perspective distortion corrected data. Through the perspective distortion correction, the distorted shape of the substrate caused by capturing in an oblique direction can be corrected to a circular shape. Also, the edge part of the substrate can be detected after the central point of the substrate is detected. By detecting the edge part and limiting the edge scope and then synthesizing them, preprocessing data can be formed for learning. According to an embodiment of FIG. 6, by setting the value of r to 140 or 150, and limiting the scope of θ to a certain part, a portion of the substrate where there may be a possibility of a wetting error can be chosen as the region of interest and thus learning can be conducted thereon. Through the learned data on the region of interest, the wetting state of the substrate can be checked, and when the substrate's wetting is not complete an alarm is given to the user to allow maintenance so that wetting may be completed.

The purpose of the inventive concept is to provide a method for diagnose the substrate treatment process such as presence of the substrate, the aerosol spray form according to N2 flow rates, wetting of the wafer, based on deep learning technology, which overcome issues occurred in the conventional method using vision sensors.

In an embodiment of the inventive concept, using deep learning to learn images indicating the presence of the substrate in a complicated processing environment can minimize losses by diagnosing in advance chamber damage caused from damage of the substrate. Also, according to an embodiment of the inventive concept, the aerosol spray form according to the flow rates of N2 can be learned to prevent process errors by detecting in advance errors in the aerosol spray form. Also, according to an embodiment, process errors can be prevented through detecting in advance the wetting state by learning the wetting state of the substrate based on deep learning.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept. The effects of the inventive concept are not limited to the above-mentioned effects, and the unmentioned effects can be clearly understood by those skilled in the art to which the inventive concept pertains from the specification and the accompanying drawings.

What is claimed is:

1. A method for determining whether a substrate treatment process is normal using a deep learning model, the method comprising:
   receiving an input image of a substrate processing;
   preprocessing the input image;
   choosing a recognized tip area of a nozzle as a region of interest (ROI);
   learning the preprocessed input image by using a deep learning model; and
   comparing a real time substrate treatment process image and a learned data by using the trained deep learning model to determine whether the substrate treatment process is normal,
   wherein the preprocessing the input image comprises recognizing the tip area of a nozzle in the input image of the substrate processing, a chemical being sprayed from the tip area of the nozzle from which a chemical is to be sprayed,
   wherein the learning the preprocessed input image by using the deep learning model comprises learning the ROI according to flow rates of the chemical.

2. The method of claim 1, wherein the preprocessing the input image comprises correcting a perspective distortion of the input image.

3. The method of claim 2, wherein the preprocessing the input image further comprises detecting a shape of a substrate from the perspective distortion corrected input image and detecting a central point of the shape of the substrate.

4. The method of claim 3, wherein the preprocessing the input image further comprises converting a coordinate system to a polar coordinate system based on the detected central point.

5. The method of claim 4 further comprising choosing a constant edge range of the substrate in the polar coordinate system as a region of interest (ROI).

6. The method of claim 5, wherein learning the preprocessed input image by using the deep learning model comprises learning the ROI.

7. A substrate treatment process apparatus for processing a substrate by spraying a chemical, the substrate treatment process apparatus comprising:
   an image capturing unit for capturing an image of the substrate and a chemical being sprayed on the substrate; and
   a determining unit for determining whether a substrate treatment process is normal by using a deep learning model, wherein the determining unit comprises:
      a preprocessing unit for preprocessing data of the image captured by the image capturing unit;
      a learning unit for learning the preprocessed data by using a deep learning model; and
      a comparing unit that determines whether the substrate treatment process is normal by comparing data of a real time substrate treatment process image and the learned data in the learning unit,
   wherein the determining unit determines whether the substrate treatment process is normal based on either an aerosol spray form inside a chamber in which the substrate processes is performed or a wetting of the substrate,
   wherein the preprocessing unit chooses a part of the image of the substrate and a chemical sprayed on the substrate captured by the image capturing unit as a region of interest (ROI),
   wherein the ROI is a tip area in an image of the substrate processing, the tip area being a chemical sprayed area by a nozzle, and
   wherein the learning unit learns the ROI according to flow rates of the chemical.

8. The substrate treatment process apparatus of claim 7, wherein the preprocessing unit is further configured to compensate a perspective distortion of the date of the mage.

9. The substrate treatment process apparatus of claim 8, wherein the preprocessing unit is further configured to detect a shape of a substrate from the perspective distance distortion corrected data, and detect a central point from the shape of the substrate.

10. The substrate treatment process apparatus of claim 9, wherein the preprocessing unit converts a coordinate system into a polar coordinate system based on the detected central point.

11. The substrate treatment process apparatus of claim 10, wherein the preprocessing unit chooses a constant edge range of the substrate in the polar coordinate system as a ROI.

12. A method for determining whether a wetting state of a substrate by using a deep learning model, the method comprising:
- receiving an input image of a substrate processing;
- preprocessing the input image;
- learning the preprocessed input image by using a deep learning model; and
- comparing a real time substrate treatment process image and the learned data by the deep learning model and determining whether a substrate treatment process is normal,
  - wherein the preprocessing an input image comprises recognizing a tip area in the input image of the substrate processing, the tip area being a chemical sprayed area by a nozzle,
  - wherein the learning the preprocessed input image by using the deep learning model comprises learning the ROI according to flow rates of the chemical.

* * * * *